United States Patent [19]
Montoya

[11] Patent Number: 5,867,032
[45] Date of Patent: Feb. 2, 1999

[54] PROCESS FOR TESTING A SEMICONDUCTOR DEVICE

[75] Inventor: Thomas T. Montoya, Austin, Tex.

[73] Assignee: Motorola, Inc., Schaumburg, Ill.

[21] Appl. No.: 565,141

[22] Filed: Nov. 30, 1995

[51] Int. Cl.$^6$ .................................................. G01R 31/02
[52] U.S. Cl. .......................................... 324/762; 324/754
[58] Field of Search .................................... 324/754, 72.5, 324/761, 762, 760, 765; 439/482, 824

[56] References Cited

U.S. PATENT DOCUMENTS

| | | | |
|---|---|---|---|
| 4,480,223 | 10/1984 | Aigo | 324/752 |
| 4,518,914 | 5/1985 | Okubo et al. | 324/158 F |
| 4,523,144 | 6/1985 | Okubo et al. | 324/158 P |
| 4,563,640 | 1/1986 | Hasegawa | 324/754 |
| 4,780,670 | 10/1988 | Cherry | 324/754 |
| 4,998,062 | 3/1991 | Ikeda | 324/754 |
| 5,126,662 | 6/1992 | Jinbo | 324/754 |

OTHER PUBLICATIONS

Zimmermann, "SiProbe—A New Technology for Wafer Probing", IEEE, International Test Conference Paper 4.3, pp. 106–112 (1995) (unavailable month).

"Intel A80502–120 Pentium Processor;" Integrated Circuit Engineering Corp.; p. 12, Figs. 5,6,6a, and 7 (Jun. 1995).

*Primary Examiner*—Vinh P. Nguyen
*Attorney, Agent, or Firm*—George R. Meyer

[57] ABSTRACT

Large diameter probe tips (42) can be used to probe a semiconductor device (60). The probe tips (42) are oriented more perpendicular to the surface of the semiconductor device (60) and are less likely to cause damage to the semiconductor device (60). The probe tips (42) can be used with a semiconductor device (60) having elongated electrodes (64) such that a small pitch for the electrodes can be used. Small diameter probe tips (102) can also be used and have a reduced likelihood of contacting a passivation layer (36) during probing.

19 Claims, 4 Drawing Sheets

PROCESS FOR TESTING A SEMICONDUCTOR DEVICE

FIELD OF THE INVENTION

The present invention relates to testing, and in particular, to probe tips, probe cards, semiconductor devices, processes for testing semiconductor devices using the probe tips, probe cards, and semiconductor devices.

BACKGROUND OF THE INVENTION

Semiconductor devices are typically tested after manufacturing to make sure that a functional semiconductor device has been formed. Other sorts of tests, such as classifying a functioning semiconductor device according to speed, etc., is usually performed also using the same or similar equipment.

One type of equipment has a probe card with probe tips. FIG. 1 includes an illustration of a portion of a probe card 10 that includes a base 14 and a probe tip 12. The base 14 is typically an insulating material, and the probe tip 12 is typically a conductor, such as a metal-containing material. The probe tip 12 includes a beam section 122 and a tip section 124. The beam section forms an angle $\theta$ with respect to the bottom surface of the base 14. Angle $\theta$ is typically 3 degrees. Angle $\Omega$ is formed between the beam section 122 and the tip section 124 and in a range of 103–106 degrees.

FIG. 2 includes another type of probe card 20 that includes a base 24 with an opening 26. The probe tip 22 includes a beam portion 222 and a tip portion 224 that are two discrete portions. Probe tip 22 further includes a bump 226 that allows the probe tip to move a limited distance in a vertical direction because the combination of the tip portion 224 and the bump 226 is larger than the diameter of the opening 26.

The probe tips of FIG. 1 or 2 are used to scrape a portion of a pad of a semiconductor device to break through an oxide on the pad. If the pad includes aluminum, the aluminum forms aluminum oxide when exposed to air. Aluminum oxide is an insulator and must be broken through in order to probe properly the semiconductor device.

FIG. 3 includes an illustration of the probe card 20 during the probing of a semiconductor device 30. The semiconductor device 30 includes a base 32 that includes an insulating layer, a pad 34, and a passivation layer 36. When the semiconductor device 30 is tested, the semiconductor device 30 is typically moved toward the base 24 of the probe card 20. When the probe tip 22 contacts the semiconductor substrate 30, the probe tip 22 moves upward until the bump 226 hits the base 24.

After the bump 226 hits the base 24, the tip section 224 below the base 24 is deflected which causes the end of the probe tip 24 to move along the pad 34. The end of the probe tip 24 typically moves one unit of distance along the pad 34 for every ten units or less of vertical movement of the substrate. As can be seen in FIG. 3, the probe tip 22 can hit the passivation layer 36 causing a piece 362 of the passivation layer 36 to break. When this piece 362 is removed, an edge 38 of the pad 34 is now exposed which may allow moisture or other contaminants to migrate beneath the passivation layer. Such a result is typically not desired due to problems with reliability. The probe tip 12 of FIG. 1 suffers from a similar problem because the probe tip can move too far and break off a piece of passivating material.

A need exists for testing integrated circuits in a nondestructive manner that allows accurate probing. A need also exists for testing semiconductor devices with small pad pitch.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

Large diameter probe tips can be used to test semiconductor device. The probe tips are oriented more perpendicular to the semiconductor device surface and are less likely to cause damage to the semiconductor device. The probe tips can be used with a semiconductor device having elongated electrodes such that a small pitch for the electrodes can be used. Small diameter probe tips can also be used and have a reduced likelihood of contacting a passivation layer during probing. The present invention is better understood with the embodiments that follow.

Probe Tips and Probe Cards

Figure 1:
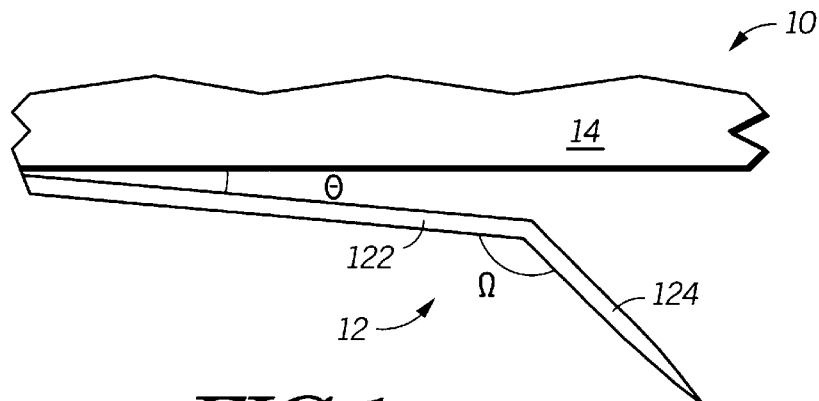
FIGS. 1–3 includes side views of portions of probe cards in accordance with prior art designs.
Figure 2:
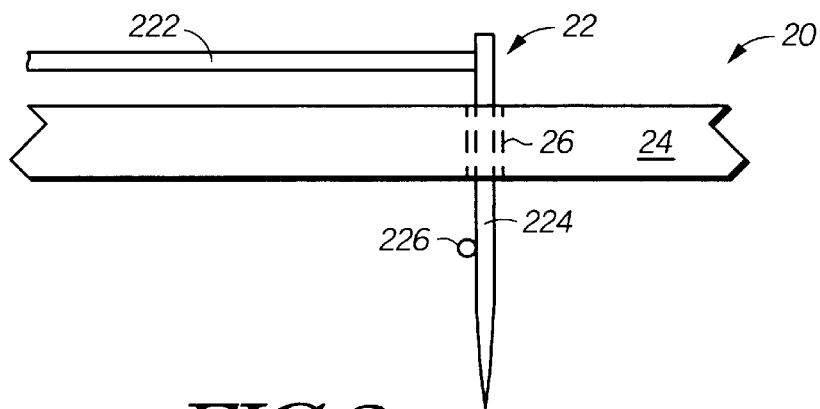
Figure 3:
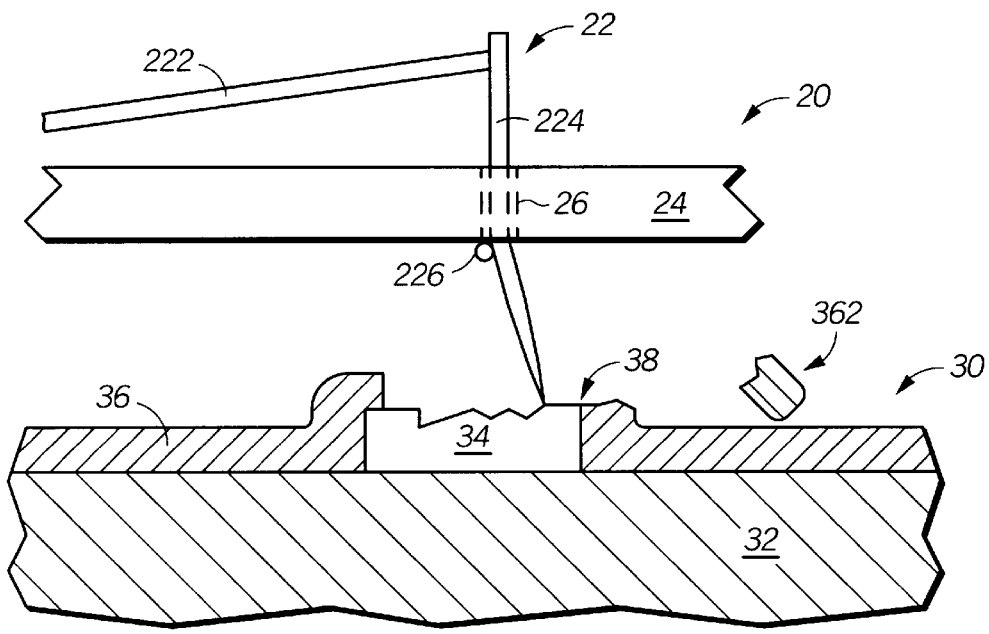
Figure 4:
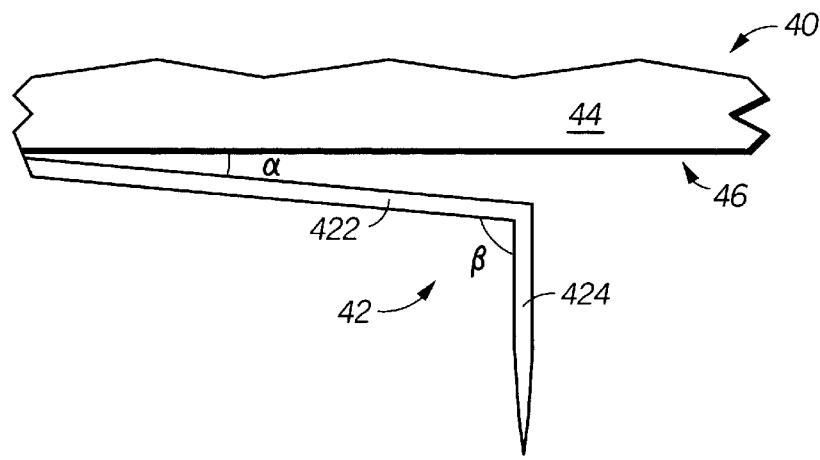
FIG. 4 includes a side view of a portion of a probe card having a probe tip in accordance with an embodiment of the present invention.

FIG. 4 includes a side view of a portion of a probe card 40 that includes a probe tip 42 and a base 44. The base 44 includes an insulating material and has a lower surface 46 that generally lies along a plane. The probe tip 42 is conductive and includes beryllium copper, tungsten iridium, tungsten, gold, or the like. The probe tip 42 is a unitary angular probe tip that includes a beam section 422 and a tip section 424. As used in this specification, unitary angular probe tip means that the probe tip is a single piece probe tip that has a permanent bend and is not a combination of two pieces that are attached together.

In FIG. 4, the beam section 422 forms an angle $\alpha$ with respect to the surface 46 of the base 44. Angle $\alpha$ is typically in a range of approximately 1–5 degrees and is usually about 3 degrees. The tip section 424 makes an angle $\beta$ with respect to beam section 422. Angle $\beta$ is typically less than 100 degrees and is usually in a range of approximately 80–95 degrees. The sum of angles $\alpha$ and $\beta$ is less than 105 degrees and usually is in a range of approximately 80–100 degrees.

If the probe tip 42 is used for small pitch applications, the sum of angles α and β is in a range of approximately 85–95 degrees. For example, angle α can be 3 degrees, and β can be 87 degrees. As used in this specification, pitch is the distance between centers of two immediately adjacent electrodes of a semiconductor device.

Figure 5:
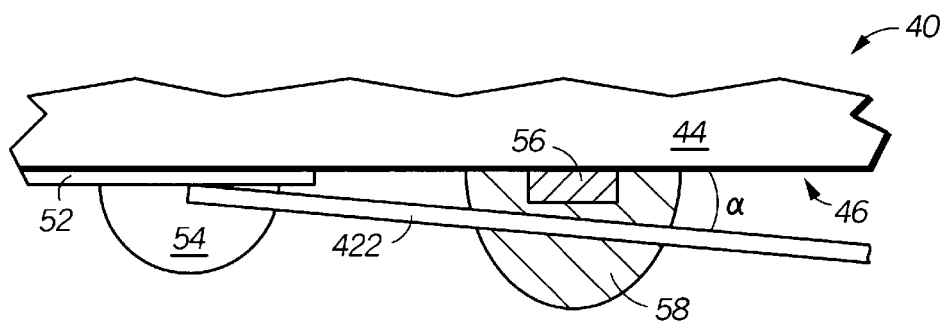
FIG. 5 includes a cross-sectional view of a portion of the probe card of FIG. 4 illustrating how the probe tip is connected to the probe card.

FIG. 5 includes a cross-sectional view of a portion of the probe card 40 near the one end of the beam section 422.

Angle α is established when attaching the probe tip to the probe card 40. The probe tip and base are placed in a jig to obtain the correct value for angle α. An epoxy compound is forced through a mold that forms an epoxy bump 58 near block 56, a portion of which is shown in FIG. 5. The base 44 also includes a trace 52 that is typically a patterned conductor lying near surface 46. The trace 52 is electrically connected to the beam section 422 with solder 54. In alternate embodiments, other types of electrical connections between the trace 52 and beam section 422 can be used.

Processes for Testing Semiconductor Devices

Figure 6:
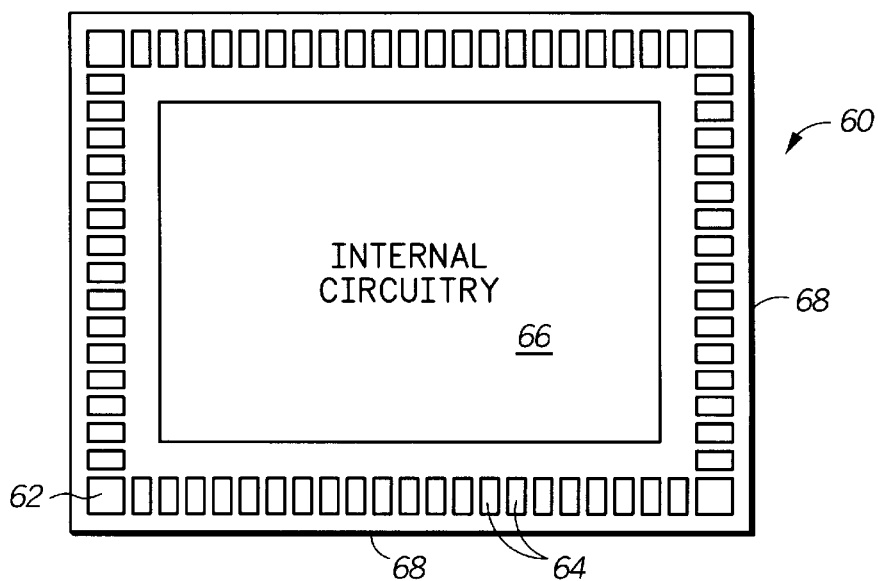
FIG. 6 includes a schematic representation of a semiconductor device.

FIG. 6 includes a top view of a semiconductor device 60 that includes internal circuitry 66, electrodes 62 and 64, and scribe lines 68. The electrodes 62 and 64 are located near one of the scribe lines 68. The electrodes 62 and 64 are oriented in a direction parallel to that scribe line 68. The widths of electrodes 64 are parallel to the scribe line 68, and the lengths of the electrodes 64 are perpendicular to the scribe line 68. As can be seen, electrodes 64 are elongated because each of the lengths of the electrodes 64 is at least three times longer than its corresponding width.

Figure 7:
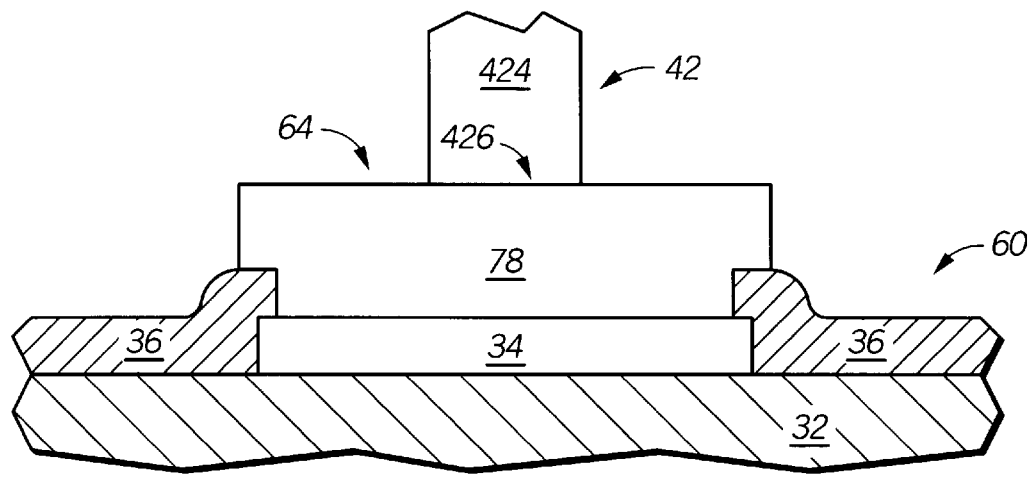
FIGS. 7 and 8 include illustrations of cross-sectional views of a portion of a probe tip and the semiconductor device of FIG. 6 during testing using an embodiment of the present invention.
Figure 8:
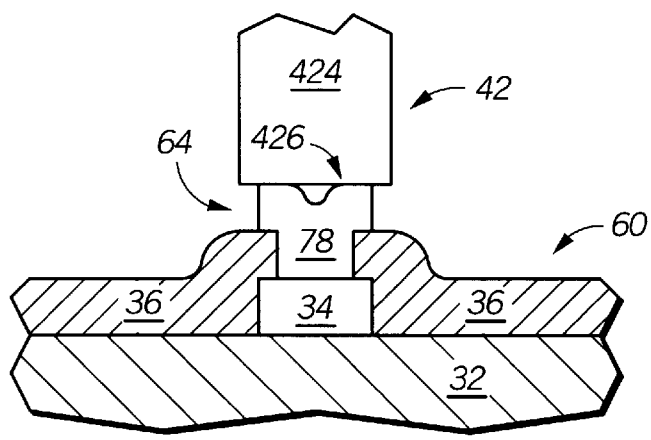

The probe card 40 is used to test the semiconductor device 60. FIGS. 7 and 8 include cross-sectional views of portions of the probe tip 42 and the semiconductor device 60. In this particular embodiment, the electrodes 64 have aluminum-containing pads 34 and gold-containing bumps 78. An adhesion or a barrier layer may lie between the pads 34 and bumps 78 but is not shown in FIGS. 7 and 8. Clearly, other conductive materials could be used with or in place of the pads 34 or bumps 78. For example, the bump 78 could include another conductor that is resistant to oxidation, such as platinum.

A testing apparatus typically includes a prober and a tester. The prober includes a chuck or stage, and the tester includes the probe card 40 and a computer. The semiconductor device is placed onto the chuck or stage and the probe card is placed into the tester. The distance between probe card 40 and semiconductor device 60 is reduced. This can be accomplished by moving the semiconductor device 60 up towards the probe card 40 or moving the probe card 40 down towards the semiconductor device 60. The reduction in distance is typically in a direction perpendicular to the surface 46 of the probe card 40 and the device surface of the semiconductor device 60.

The reduction in distance can be characterized by two portions. The first portion allows initial contact to be made between a probe tip 42 and the electrodes 62 (not shown in FIGS. 7 and 8) and 64. The second portion is an overdrive portion that, in part, takes into account potential non-uniformity of the distances between probe tips 42 and electrodes 62 and 64. The overdrive portion is typically characterized as a portion of the total distance reduction. Because gold-containing bumps 78 are present, the overdrive portion can be kept to a minimum because the bumps 78 are resistant to forming a surface oxide. The overdrive portion is not extended to allow for breaking through a surface oxide. The probe tips 42 do not significantly move along the surface of the bumps 78.

In FIGS. 7 and 8, a probe end 426 of the tip section 424 of one of the probe tips 42 contacts the bump 78 of one of the electrodes 64. FIGS. 7 and 8 are illustrations that lie along planes that are perpendicular to each other. Each of the widths of the bump 78 and opening in the passivation layer 36 is narrower than the diameter (width) of the probe end 426 as shown in FIG. 8. The probe end 426 extends beyond the edges of the bump 78. The wide probe end 426 allows contact to be made without causing significant damage to the bump 78 because the force related to the overdrive portion is spread over a larger area (less pressure).

Figure 9:
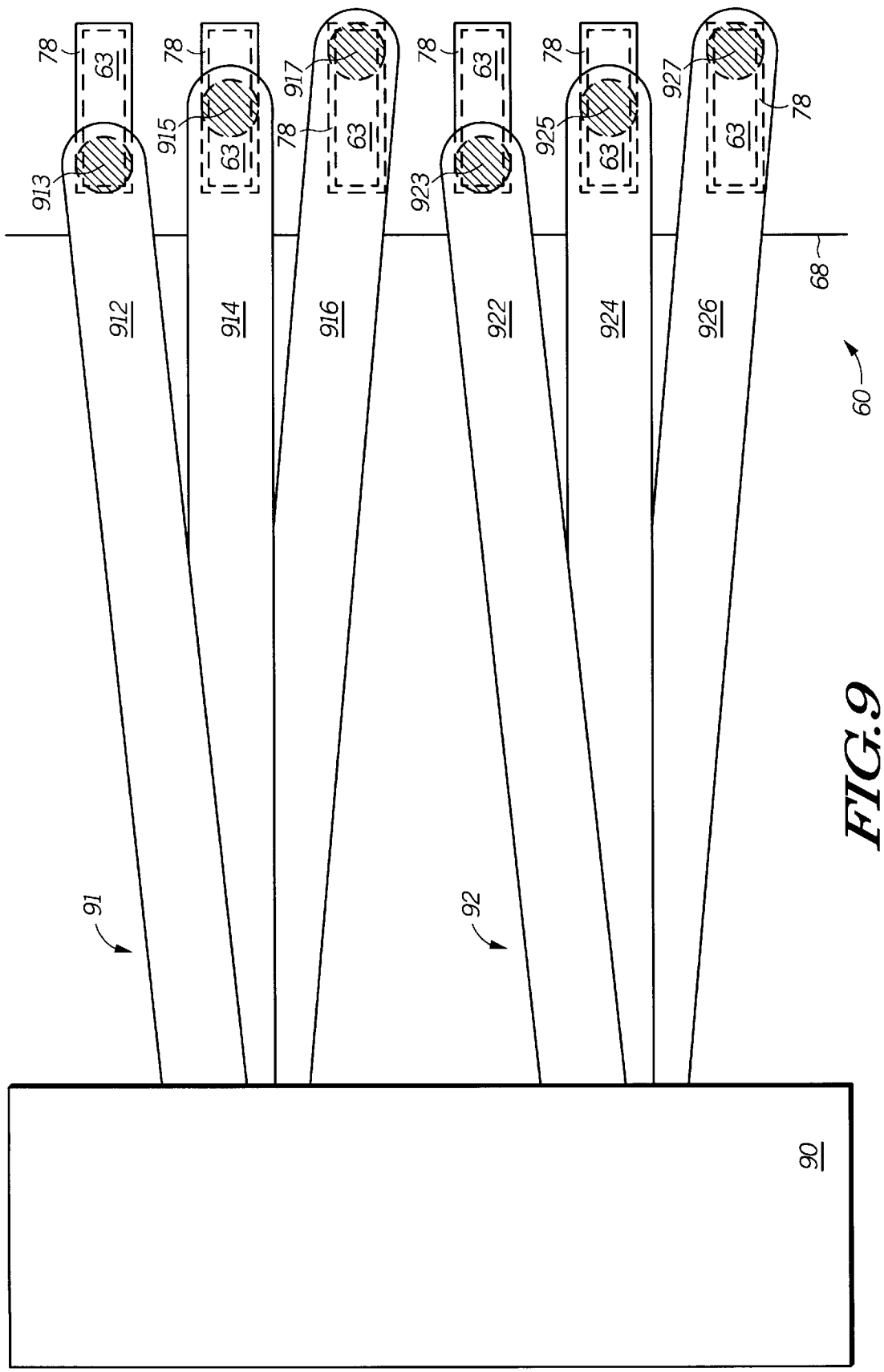
FIG. 9 includes an illustration of a top view of a portion of a probe card and a semiconductor device in accordance with another embodiment of the present invention.

In another embodiment, a series of the probe tips may be used with respect to the electrodes 64 as shown in FIG. 9. Probe card 90 includes two sets 91 and 92 of probe tips 912, 914, 916, 922, 924, and 926. Each of these probe tips are similar to probe tip 42. Within FIG. 9, the beam sections and probe ends 913, 915, 917, 923, 925, and 927 of the probe tips are illustrated. The beam section of probe tip 912 overlies a portion of the beam section of probe tip 914, and the beam section of probe tip 914 overlies a portion of the beam section of probe tip 916. A similar relationship holds for the beam sections of probe tips 922, 924, and 926. The semiconductor device 60 includes the scribe line 68 and conductive bumps 78. Dashed lines 63 correspond to openings in the passivation layer that underlie the bumps 78.

The probe ends 913, 915, and 917 are wider than the openings 63. The probe ends 913, 915, and 917 are staggered along the scribe line 68. The probe ends 923, 925, and 927 are also staggered. They are oriented in a direction that forms an acute angle when extended to the scribe line 68. By using the elongated electrodes and staggering the probe ends, these tip portions can be arranged more efficiently to allow testing of electrodes placed on the device 60 at small pitches. Table I includes a list of values for the electrode widths and lengths for a given pitch size.

TABLE I

| Electrode Pitch (μm) | Electrode Width (μm) | Electrode Length (μm) |
|---|---|---|
| 50 | 16 | 100 |
| 60 | 23 | 100 |
| 70 | 33 | 100 |

In this embodiment, the vertical displacement of probe tips and elongated electrodes allow electrode pitches less than 75 μm to be met without a high risk of electrodes electrically shorting to one another. In Table I, the length divided by the width for the various pitches are typically in a range of 3–6.

Figure 10:
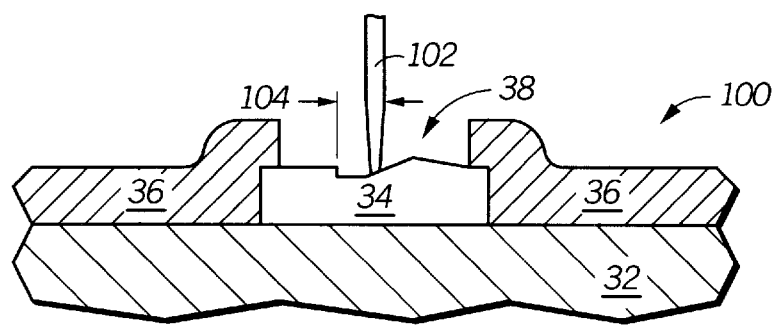
FIG. 10 includes an illustration of a cross-sectional view of a portion of a probe tip and semiconductor device in accordance with still another embodiment of the present invention.

Although a previous embodiment described using large diameter probe tips, a smaller diameter probe tip 102 can be used as shown in FIG. 10. The semiconductor device 100 includes the base 32, the pad 34, and passivation layer 36. In this particular embodiment, the pad 34 does not have a bump overlying it within the pad opening 38 of the passivation layer 36. In this embodiment, the electrode is the portion of the pad 34 that underlies the pad opening 38. In this embodiment, the probing area corresponds to the pad opening 38. The pad 34 includes a conductive material that forms an insulating oxide when exposed to air. For example, the pad 34 includes aluminum. The probe tip 102 is similar to probe tip 42 except that the end of the probe tip 102 is narrower than the passivation layer opening 38.

To probe the device 100, the probe tip 102 breaks through a surface oxide layer (not shown) of the pad 34. The overdrive portion of the probing is more aggressive. During the overdrive portion, the probe tip 102 moves in a lateral direction for a distance as illustrated by dimension 104. For each unit of lateral movement of the probe tip 104, the overdrive portion reduces the distance between the semiconductor device 100 and probe card (not shown in FIG. 10) in a range of approximately 20–100 units. For example, if the overdrive portion reduces the distance between the semiconductor device 100 and probe card by 500 microns, the dimension 104 is in a range of approximately 5–25 microns. Older probing methods would have a lateral movement of about 50 microns. The smaller dimension 104 is obtained by keeping the sum of the angles α and β no greater than 105 degrees. Within the range 5–25 microns, the sum of α and β is closer to 90 degrees for the 5 micron dimension compared to the 25 micron dimension.

Benefits

The embodiments of present invention has benefits. By using a large diameter probe tip, a semiconductor device is less likely to suffer severe damage during probing. In one embodiment of the present invention, the larger probe tips can be used because the bumps are outside the openings in the passivation layer. In this situation, the probe tips can extend beyond the edge of the bump. Typically, no damage occurs because the passivation layer does not directly contact the probe tips.

Another benefit of the present invention is that it allows a tight electrode pitch to be used. A further benefit is it allows different types of layouts for the probe card to be used for the tight electrode pitches. Referring to the elongated pads, the probe card has probe tips that are vertically displaced and staggered. The staggered probe tips allow the placement of the probe tips to be made without interfering with one another on the semiconductor device.

A further benefit of the embodiment of the present invention is that it allows the use of small passivation openings over pads. By choosing an appropriate sum of angles α and β close to 90 degrees, the lateral movement of the probe tip during the overdrive portion of the probe movement itself allows a small bond pad to be formed that has a reduced risk that the passivation layer will be damaged during the probing. This reduced chance of passivation damage allows a more reliable device to be formed because the passivation layer remains intact and does not form any cracks or interfaces through which moisture or other contaminants can readily pass to the underlying device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

I claim:

1. A process for testing a semiconductor device comprising the steps of:

placing a probe card into a testing apparatus, wherein:
   the probe card has a base and probe tips;
   each probe tip has a beam section having a base end and a tip section having a probe end;
   the base end of the beam section is closer to the base compared to the probe end of the probe section;
   the probe tips include a first probe tip, a second probe tip, and a third probe tip;
   from a top view, the second probe tip lies between the first probe tip and the third probe tip;
   from a top view, one of the first and second probe tips overlies the other of the first and second probe tips at a point closer to their base ends compared to their probe ends; and
   from a top view, one of the second and third probe tips overlies the other of the second and third probe tips at a point closer to their base ends compared to their probe ends;

placing the semiconductor device into the testing apparatus, wherein:
   the semiconductor device has a scribe line and electrodes; each of the electrodes has a length and a width that is narrower than the length;
   the scribe line lies along a first direction;
   the widths extend in a second direction that is parallel to the first direction; and
   the lengths extend in a third direction that is perpendicular to the first direction; and reducing a distance between the base of the probe card and the semiconductor device such that the probe ends contact the electrodes, wherein:
   this step is performed for a first distance;
   the probe end of the first probe tip is furthest from the scribe line compared to the probe ends of the second and third probe tips;
   the probe end of the third probe tip is closest to the scribe line compared to the probe ends of the first and second probe tips; and
   the probe end of the second probe tip is at an intermediate distance from the scribe line compared to probe ends of the first and third probe tips.

2. The process of claim 1, wherein the step of reducing includes an overdrive portion, wherein, during the overdrive portion:

the step of reducing the distance continues after initial contact between the probe ends and electrodes for a second distance in the first direction, wherein the second distance is a portion of the first distance; and
   at least one of the probe ends does not significantly move in any direction that is substantially perpendicular to the first direction.

3. The process of claim 1, wherein the step of reducing includes an overdrive portion, wherein, during the overdrive portion:

the step of reducing the distance continues after initial contact between the probe ends and electrodes for a second distance in the first direction, wherein the second distance is a portion of the first distance;
   a plurality of the probe ends move third distances in a fourth direction that is substantially perpendicular to the first direction; and
   the second distance is more than 20 times farther than each of the third distances.

4. The process of claim 1, wherein the step of placing the probe card is performed such that:

the base has a surface adjacent to the probe tips, where in the surface generally lies along a plane;
   the beam section lies at a first angle with respect to the plane;
   the tip section lies at a second angle with respect to the beam section; and a sum of the first and second angles is no greater than 105 degrees.

5. The process of claim 4, wherein the step of placing the probe card is performed such that the sum of the first and second angles is in a range of approximately 80–100 degrees.

6. The process of claim 4, wherein the step of placing the probe card is performed such that the first angle is in a range of approximately 1–5 degrees.

7. The process of claim 4, wherein the step of placing the probe card is performed such that the second angle is less than 90 degrees.

8. The process of claim 4, wherein the step of placing is performed such that each of the probe tips is a single piece of material.

9. The process of claim 4, wherein the step of placing the probe card is performed such that the probe card further includes an attaching material that attaches the beam sections of the probe tips to the probe card, wherein the attaching material contacts the beam sections at points spaced apart from ends of the beam sections.

10. The process of claim 9, wherein the step of placing the probe card is performed such that the attaching material includes an epoxy bump.

11. The process of claim 9, wherein the step of placing the probe card is performed such that the probe card further includes traces, wherein the beam ends are electrically connected to the traces.

12. The process of claim 1, wherein:
a portion of the beam section of the third probe tip overlies a portion of the beam section of the second probe tip; and
a portion of the beam section of the second probe tip overlies a portion of the beam section of the first probe tip.

13. The process of claim 1, wherein:
the step of placing is performed such that the probe tips includes a fourth probe tip, a fifth probe tip, and a sixth probe tip;
the fourth probe tip lies adjacent to the third probe tip;
the fifth probe tip lies between the fourth and sixth probe tips; and
the step of reducing is performed such that:
the probe end of the fourth probe tip is closest to the scribe line compared to the probe ends of the second, third, fifth, and sixth probe tips;
the probe end of the sixth probe tip is farthest from the scribe line compared to the probe ends of the first, second, fourth and fifth probe tips; and
the probe end of the fifth probe tip is at an intermediate distance from the scribe line compared to probe ends of the first, third, fourth, and sixth probe tips.

14. The process of claim 1, wherein the step of placing is performed such that:
a portion of the beam section of the first probe tip overlies a portion of the beam section of the second probe tip; and
a portion of the beam section of the second probe tip overlies a portion of the beam section of the third probe tip.

15. The process of claim 1, wherein the steps of placing the probe card and placing the semiconductor device are performed such that the semiconductor device has a passivation layer including a plurality of openings, wherein each opening is narrower than each width of the probe ends.

16. The process of claim 15, wherein the step of placing the probe card is performed such that each of the widths of the probe ends are wider than the widths of the electrodes.

17. The process of claim 16, wherein the each of the widths of the electrodes is no greater than approximately 33 microns.

18. The process of claim 1, wherein the steps of placing the probe card and placing the semiconductor device are performed such that the semiconductor device has a passivation layer including a plurality of openings, wherein each opening is wider than each width of the probe ends.

19. The process of claim 1, wherein each of the beam sections of the first probe tip, the second probe tip, and the third probe tip is of a substantially uniform, same width.

* * * * *